United States Patent [19]

Suganuma

[11] 4,229,707
[45] Oct. 21, 1980

[54] AUTOMATIC GAIN CONTROL CIRCUIT

[75] Inventor: Hisashi Suganuma, Kawagod, Japan

[73] Assignee: Pioneer Electronic Corporation, Tokyo, Japan

[21] Appl. No.: 930,116

[22] Filed: Aug. 1, 1978

[30] Foreign Application Priority Data

Aug. 1, 1977 [JP] Japan .................................. 52-81552
Aug. 10, 1977 [JP] Japan .................................. 52-95814

[51] Int. Cl.² .......................... H03F 3/16; H03G 3/30
[52] U.S. Cl. .................................. 330/277; 330/283; 330/285; 330/300
[58] Field of Search ............... 330/277, 283, 285, 297, 330/300

[56] References Cited

U.S. PATENT DOCUMENTS

| | | | |
|---|---|---|---|
| 3,331,028 | 7/1967 | Bay et al. | 330/283 |
| 3,388,338 | 6/1968 | Austin | 330/285 X |
| 3,480,873 | 11/1969 | Garter | 330/285 X |
| 3,562,656 | 2/1971 | Bateman | 330/277 X |

FOREIGN PATENT DOCUMENTS 1930926 12/1970 Fed. Rep. of Germany ........... 330/283

*Primary Examiner*—James B. Mullins
*Attorney, Agent, or Firm*—Sughrue, Rothwell, Mion, Zinn & Macpeak

[57] ABSTRACT

An automatic gain control circuit where the direct current potential levels of the gate and the source of a field effect transistor in a preamplifier stage are maintained substantial equal during automatic gain control. In the first embodiment, the gate of the field effect transistor is responsive to a high frequency input signal and the drain provides the amplified high frequency input signals as an output signal. The source is connected to electrical ground by an inductor and is connected to a voltage source having a voltage level controlled in accordance with the automatic gain control signal. The inductor acts to shunt to ground the direct current component of the supply voltage provided to the source. In the second embodiment, the gate of the field effect transistor is responsive to a high frequency input signal and the drain is connected to electrical ground. The source provides the amplified high frequency input signal as an output signal, and also is connected to a voltage source having a voltage level controlled in accordance with the automatic gain control signal. The direct current levels of the gate and source are therefore maintained substantially equal.

4 Claims, 2 Drawing Figures

AUTOMATIC GAIN CONTROL CIRCUIT

BACKGROUND OF THE INVENTION

1. Field of the Invention

The present invention relates generally to automatic gain control circuits, and more particularly, to an automatic gain control circuit exhibiting a decrease in the intermodulation distortion level and an increase in the signal-to-noise ratio under automatic gain control.

2. Description of the Prior Art

The conventional automatic gain control circuit operates to maintain constant the level of the received signals, whereby the average level of the output audio signal from the receiver is maintained constant. In other words, the automatic gain control circuit results in the signal level of the audio output signal being substantially constant and, thus, immune to fluctuations in the level of the received signal. The constant level of the audio signal is a very attractive feature, and this accounts for the fact that almost all currently available radio receivers include automatic gain control circuits.

One type of conventional automatic gain control circuit is so designed that the gate or source of an active device, such as a field effect transistor, used in a preamplifier stage for amplifying the radio frequency signals present at the antenna input terminal, is provided with an automatic gain control signal to maintain substantially constant the level of the output signal from the preamplifier stage.

The automatic gain control signal so provided has a direct current component and also has an alternating current component when the level of the radio frequency signals present at the antenna input terminal or the like is rapidly fluctuating. Thus, in the conventional automatic gain control circuit described above, the gate and the source of the field effect transistor usually have different direct current potential levels. The different potential levels result in the conventional automatic gain control circuit exhibiting an increase in the intermodulation distortion level and a decrease in the signal-to-noise ratio under automatic gain control.

SUMMARY OF THE INVENTION

It is an object of the present invention to provide an automatic gain control circuit which exhibits a decrease in the intermodulation distortion level and an increase in the signal-to-noise ratio under automatic gain control.

It is a further object of the present invention to provide an automatic gain control circuit where the direct current potential levels of the gate and source of the field effect transistor connected in the common-source configuration are maintained substantially equal.

It is an additional object of the present invention to provide an automatic gain control circuit where the direct current potential levels of the gate and source of the field effect transistor connected in the common-collector configuration are maintained substantially equal.

An automatic gain control circuit where the direct current potential levels of the gate and the source of a field effect transistor in a preamplifier stage are maintained substantial equal during automatic gain control. In the first embodiment, the gate of the field effect transistor is responsive to a high frequency input signal and the drain provides the amplified high frequency input signals as an output signal. The source is connected to electrical ground by an inductor and is connected to a voltage source having a voltage level controlled in accordance with the automatic gain control signal. The inductor acts to shunt to ground the direct current component of the supply voltage provided to the source. In the second embodiment, the gate of the field effect transistor is responsive to a high frequency input signal and the drain is connected to electrical ground. The source provides the amplified high frequency input signal as an output signal, and is also connected to a voltage source having a voltage level controlled in accordance with the automatic gain control signal. The direct current levels of the gate and source are therefore maintained substantially equal.

DETAILED DESCRIPTION OF THE INVENTION

The present invention provides an automatic gain control circuit which exhibits a decrease in the intermodulation distortion level and an increase in the signal-to-noise ratio under automatic gain control. These two results are achieved by maintaining substantially equal the direct current potential levels of the gate and source of the field effect transistor of the automatic gain control circuit. Two embodiments of the present invention are shown.

Figure 1:
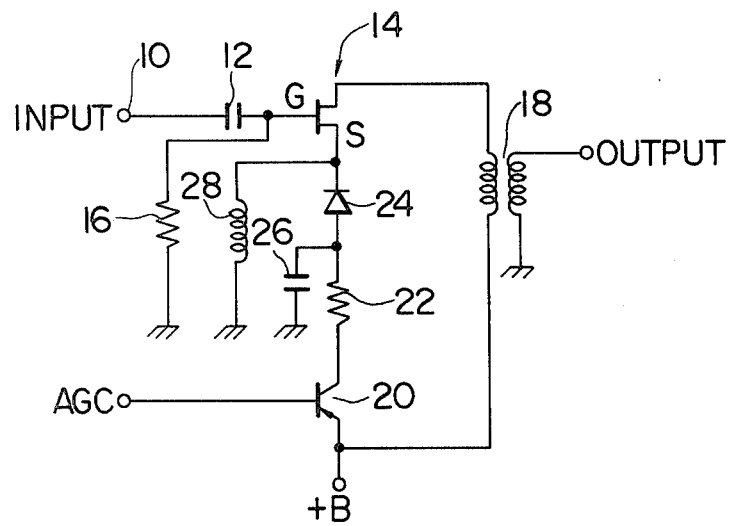
FIG. 1 is a schematic electrical diagram of the first embodiment of the automatic gain control circuit of the present invention; and, FIG. 2 is a schematic electrical diagram of the second embodiment of the automatic gain control circuit of the present invention.

In the first embodiment of the automatic gain control circuit of the present invention, as shown in FIG. 1, the radio frequency antenna signal is applied to a terminal 10. Terminal 10 is connected via a coupling capacitor 12 to the gate of an active device 14, such as a field effect transistor. A resistor 16 is connected between electrical ground and the gate of field effect transistor 14. Coupling capacitor 12 and resistor 16 form a high-pass filter which passes signals applied to terminal 10 that are in the desired high frequency range.

The drain of field effect transistor 14 is connected to one side of a winding of a coupling transformer 18, which has the other side of the winding connected to an electric source +B. The other winding of coupling transformer 18 is the output winding. Thus, field effect transistor 14 is connected in a common-source configuration.

The automatic gain control signal from another stage of the radio receiver (not shown), is provided to the base of an active device 20, such as a PNP transistor. The emitter of PNP transistor 20 is connected to electric source +B. Thus, the voltage levels of the electric source +B and of the automatic gain control signal determine the forward biasing level of the emitter-base junction of PNP transistor 20.

The collector of PNP transistor 20 is connected via a resistor 22 and a diode 24 in the forward-bias direction to the source of the field effect transistor 14. Diode 24 can be of any suitable type, such as a silicon or germanium diode. Diode 24 exhibits a variable resistance depending on the level of biasing in the forward direction. A capacitor 26 is connected between the junction of diode 24 and resistor 22 and electrical ground. Capacitor 26 is provided to bypass high frequency signals. An inductor 28 is connected between the source of field effect transistor 14 and electrical ground.

The operation of the automatic gain control circuit of the present invention is now described. Upon application of an antenna signal to terminal 10, this antenna signal is supplied through a capacitor 12 to gate of the field effect transistor 14, where it is amplified, and then is supplied via the drain through the coupling transformer 18 to the next stage of the receiver (not shown). In this operation, the direct current output at the collector of transistor 20 whose amplification level is controlled by the automatic gain control signal, is applied via the series connected resistor 22 and the variable resistance diode 24 to the source of the field effect transistor 14. Thus, the antenna signal amplified by the field effect transistor 14 is varied in response to the alternating current component of the automatic gain control signal, as a result of which the output signal of field effect transistor 14 which forms the preamplifier, is maintained at a substantially constant level at all times. On the other hand, because inductor 28 is connected between the source of the field effect transistor 14 and electrical ground, the direct current component of the output signal from transistor 20, which corresponds to the direct current component of the automatic gain control signal, is shunted to electrical ground through the inductor 28. In other words, the automatic gain controlled output signal from the collector of transistor 20 controls the biasing the field effect transistor 14 only with respect to the alternating current component of the automatic gain control signal. Accordingly, even in the case where the automatic gain control signal is applied directly to the source of field effect transistor 14 (and not via transistor 20, resistor 22, and diode 24), AGC signal direct current levels of the gate and the source of the field effect transistor 14 are maintained substantially constant and equal due to the direct current shunting to ground by inductor 28. When the automatic gain control operation is carried out, negative feedback is effected, and the signal distortion is reduced. Accordingly, the intermodulation distortion level is reduced and the signal-to-noise ratio is increased under automatic gain control in the first embodiment of the present invention.

Figure 2:
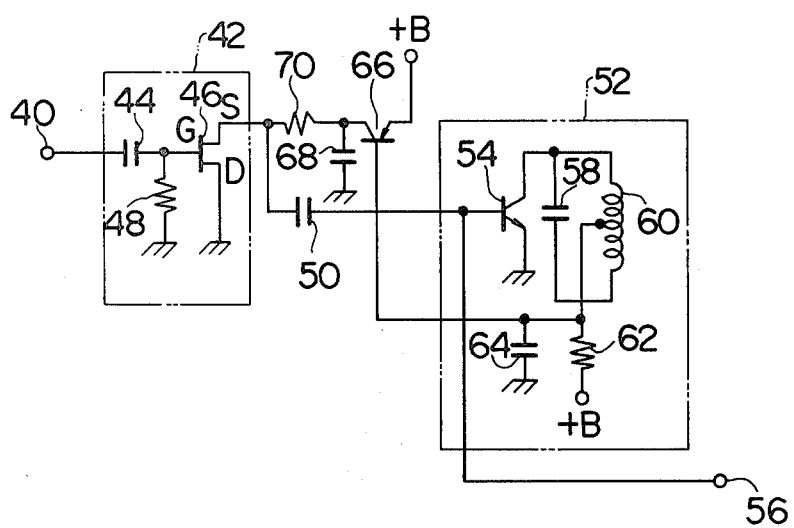

In the second embodiment of the automatic gain control circuit of the present invention, as shown in FIG. 2, the radio frequency antenna signal is applied to a terminal 40. Terminal 40 is connected to the input of a preamplifier, designated generally by the reference numeral 42. Specifically, terminal 40 is connected via a coupling capacitor 44 to the gate of an active device 46, such as a field effect transistor 46. A resistor 48 is connected between electrical ground and the gate of field effect transistor 46. Coupling capacitor 44 and resistor 48 form a high-pass filter which passes signals applied to terminal 40 that are in the desired high frequency range.

The drain of field effect transistor 46 is connected to electrical ground, and the source of field effect transistor 46 is connected via a coupling capacitor 50 to the input of a tuning circuit, designated generally by the reference numeral 52. Thus, field effect transistor 46 is connected in a common-drain configuration. In the common-drain configuration, the amplification factor of the field effect transistor decreases as the potential on the source with respect to the gate is increased.

Tuning circuit 52 includes an NPN transistor 54, whose emitter is connected to electrical ground, and whose base is connected to coupling capacitor 50 and is provided with an automatic gain control signal from a terminal 56. Coupling capacitor 50 prevents the direct current component of the automatic gain control signal from being passed to the source of field effect transistor 46. The collector of transistor 54 is connected to one side of a capacitor 58 and a winding of a high frequency transformer 60 connected in parallel. A center tap of transformer 60 is connected via a resistor 62 to an electric source +B and to electrical ground via capacitor 64. Capacitor 64 is provided to bypass high frequency signals. It should be noted that an automatic gain control signal is present at the center tap of transformer 60.

The automatic gain control signal present at the center tap of transformer 60 is provided to the base of an active device 66, such as a PNP transistor 66. The emitter of transistor 66 is connected to electric source +B. Thus, the voltage levels of the electric source +B and of the automatic gain control signal determine the forwarding biasing level of the emitter-base junction of the PNP transistor 66. The collector of PNP transistor 66 is connected via a resistor 70 to the source of field effect transistor 46. A capacitor 68 is connected between the collector of transistor 66 and electrical ground and is provided to bypass high frequency signals.

In the automatic gain control circuit of the second embodiment of the present invention, the supply voltage applied to the source of the field effect transistor 46 is controlled in accordance with the automatic gain control signal applied to the base of PNP transistor 66. Specifically, the direct current component of the supply voltage is raised and lowered by the automatic gain control direct current component at the base of PNP transistor 66 in accordance with the direct current level at the gate of field effect transistor 46. Thus, the potentials present at the gate and source of field effect transistor 46 are maintained substantially equal in the direct current mode by the automatic gain control voltage provided to the base of PNP transistor 66. Likewise, the a.c. component of the supply voltage is controlled by the a.c. component of the AGC signal in accordance with the a.c. component at the gate. Thus, the alternating current component of the automatic gain control signal controls the amplification factor of the field effect transistor 46. Because the potential levels of the gate and source of field effect transistor 46 are maintained substantially equal in the direct current mode, the intermodulation distortion level is reduced and the signal to noise ratio is increased under automatic gain control in the second embodiment of the present invention.

In the second embodiment described above, transistor 66 controlling the electric source of the field effect transistor 46 receives the signal corresponding to the automatic gain control signal supplied from the tuning circuit 52. It should be noted, however, that the second embodiment of the present invention is not limited thereto. In other words, the automatic gain control signal itself may be directly applied to the base of PNP transistor 66 to achieve the desired direct current mode of operation of field effect transistor 46.

What is claimed is:
1. An automatic gain control circuit comprising:
(a) preamplifier means having a first active device responsive to a high frequency input signal for amplifying said high frequency input signal and for providing said amplified high fequency input signal as an output signal; and
(b) supply voltage means responsive to an automatic gain control signal for providing a supply voltage in accordance with said automatic gain control (AGC) signal to said first active device having a direct current component substantially equal to the direct current component of the signal present on the input side of said first active device, said supply voltage means including an inductor connected between said supply voltage provided to said first active device and electric ground so that the direct current component of said supply voltage provided to said first active device is grounded.

2. The automatic gain control circuit as recited in claim 1, wherein said supply voltage means further includes a second active device connected between said supply voltage and said automatic gain control signal for providing said supply voltage to said first active device in accordance with said automatic gain control signal.

3. The automatic gain control circuit as recited in claim 2, wherein said first active device of said preamplifier means is a field effect transistor having a gate, a source, and a drain, said gate being responsive to said high frequency signal, said source being responsive to said supply voltage provided by said supply voltage means, and said drain providing said amplified high frequency input signal as said output signal.

4. The automatic gain control circuit as recited in claim 3, wherein said second active device of said supply means is a transistor having an emitter, a base, and a collector, said emitter connected to said supply voltage, said base connected to said automatic gain control signal, and said collector providing said supply voltage in accordance with said automatic gain control signal, and wherein said supply voltage means further includes a first resistor, a first diode, and a first capacitor, said first resistor and first diode being in series connection and connected between said collector and the side of said inductor not connected to electrical ground, and said first capacitor being connected from the junction of said first resistor and first diode to electrical ground.

* * * * *